United States Patent
Yokoshima et al.

(10) Patent No.: US 9,281,988 B2
(45) Date of Patent: Mar. 8, 2016

(54) RECEIVING DEVICE, RECEIVING METHOD, AND NON-TRANSITORY COMPUTER-READABLE STORAGE MEDIUM STORING PROGRAM

(71) Applicant: Sony Corporation, Tokyo (JP)

(72) Inventors: Hideki Yokoshima, Kanagawa (JP); Yoshihisa Takaike, Kanagawa (JP); Gerd Spalink, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/549,770

(22) Filed: Nov. 21, 2014

(65) Prior Publication Data
US 2015/0163084 A1 Jun. 11, 2015

(30) Foreign Application Priority Data
Dec. 10, 2013 (JP) ................. 2013-254732

(51) Int. Cl.
*H04L 27/26* (2006.01)
*H03F 3/189* (2006.01)
*H03G 3/30* (2006.01)

(52) U.S. Cl.
CPC ............ *H04L 27/2649* (2013.01); *H03F 3/189* (2013.01); *H03G 3/3052* (2013.01); *H03G 3/3078* (2013.01); *H04L 27/2605* (2013.01); *H04L 27/2647* (2013.01); *H04L 27/2662* (2013.01); *H04L 27/2663* (2013.01); *H03F 2200/294* (2013.01); *H03F 2200/336* (2013.01); *H03F 2200/411* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 2006/0217069 A1* | 9/2006 | Chen et al. | 455/63.1 |
| 2007/0211809 A1* | 9/2007 | Kim | 375/260 |
| 2009/0239484 A1* | 9/2009 | Miyoshi et al. | 455/91 |
| 2010/0097145 A1* | 4/2010 | Sharma et al. | 330/282 |
| 2012/0076246 A1* | 3/2012 | Okada et al. | 375/340 |
| 2012/0225631 A1 | 9/2012 | Spalink | |

OTHER PUBLICATIONS

K. Vavelidis et al., "A 65nm CMOS Multi-Standard, Multi-Band Mobile TV Tuner," (2007) IEEE, pp. 424-427.

* cited by examiner

*Primary Examiner* — Leon-Viet Nguyen
(74) *Attorney, Agent, or Firm* — Michael Best & Friedrich LLP

(57) ABSTRACT

A receiving device according to an embodiment of the present disclosure receives a signal in which a data symbol and invalidation data are arranged. The receiving device includes an amplifying unit that amplifies the input signal and a gain adjusting unit that adjusts gain of the amplifying unit in a section of the invalidation data. The present disclosure can be applied to a receiving device that receives a radio signal of an OFDM system.

15 Claims, 8 Drawing Sheets

RECEIVING DEVICE, RECEIVING METHOD, AND NON-TRANSITORY COMPUTER-READABLE STORAGE MEDIUM STORING PROGRAM

CROSS REFERENCE TO RELATED APPLICATIONS

This application claims the benefit of Japanese Priority Patent Application JP 2013-254732 filed on Dec. 10, 2013, the entire contents of which are incorporated herein by reference.

TECHNICAL FIELD

The present disclosure relates to a receiving device, a receiving method, and a non-transitory computer-readable storage medium storing program and particularly, to a receiving device, a receiving method, and a non-transitory computer-readable storage medium storing program that are used suitably when an orthogonal frequency division multiplexing (OFDM)-modulated signal is received.

BACKGROUND ART

As a modulation method of a digital signal, orthogonal frequency division multiplexing (OFDM) is known. The OFDM is adopted in digital television broadcasting, a mobile phone, and a wireless LAN.

Meanwhile, a portable terminal such as a smart phone and a tablet PC can be exemplified as an electronic apparatus receiving an OFDM-modulated signal (hereinafter, referred to as the OFDM signal). Because there is a limitation in a battery capacity of the portable terminal, low consumption power is demanded when the OFDM signal is received. In an LSI mounted to the portable terminal and having a function of receiving the OFDM signal to realize the demand, an SOC solution in which an analog circuit and a digital circuit are mounted on the same silicon is frequently adopted.

Meanwhile, as miniaturization of a semiconductor such as the LSI advances, a digital circuit in the LSI can realize a small size and low consumption power. However, in an analog circuit in the LSI, because consumption power increases or a circuit scale increases to suppress an influence such as reduction of a power-supply voltage, a benefit of the miniaturization may not be used. For this reason, in the LSI in which the SOC solution is adopted, a small size and low consumption power in the analog circuit are demanded.

FIG. 1 illustrates an example of a configuration of a receiving device according to the related art that is mounted as the LSI to the portable terminal and receives an OFDM signal.

A receiving device 10 includes a variable gain amplifier 11, frequency converting units 12I and 12Q, BB filters 13I and 13Q, variable step gain BB amplifiers 14I and 14Q, AD converting units (ADC) 15I and 15Q, a local oscillating unit (LO Gen.) 16, an AGC control unit (AGC CTRL LOGIC) 17, and an OFDM demodulating unit (DMD) 18. The variable gain amplifier 11 continuously amplifies an OFDM signal to be an RF signal, according to RF gain notified from the AGC control unit 17, and outputs the OFDM signal to the frequency converting units 12I and 12Q. The frequency converting unit 12I mixes the amplified OFDM signal with a signal for frequency conversion from the local oscillating unit 16, converts the RF signal into an IF signal, and outputs the IF signal to the BB filter 13I. The frequency converting unit 12Q mixes the amplified OFDM signal with a signal for frequency conversion from the local oscillating unit 16, converts the RF signal into an IF signal, and outputs the IF signal to the BB filter 13Q.

The BB filter 13I extracts a base band signal of an I component of the OFDM signal converted into the IF signal and outputs the base band signal to the variable step gain BB amplifier 14I. The BB filter 13Q extracts a base band signal of a Q component of the OFDM signal converted into the IF signal and outputs the base band signal to the variable step gain BB amplifier 14Q.

The variable step gain BB amplifier 14I gradually amplifies the base band signal of the I component of the OFDM signal, according to COMP. gain notified from the AGC control unit 17, and outputs the base band signal to the AD converting unit 15I. The variable step gain BB amplifier 14Q gradually amplifies the base band signal of the Q component of the OFDM signal, according to COMP. gain notified from the AGC control unit 17, and outputs the base band signal to the AD converting unit 15Q.

The AD converting unit 15I converts the base band signal of the I component of the OFDM signal into a digital signal and outputs the digital signal to the AGC control unit 17 and the OFDM demodulating unit 18. The AD converting unit 15Q converts the base band signal of the Q component of the OFDM signal into a digital signal and outputs the digital signal to the AGC control unit 17 and the OFDM demodulating unit 18.

The local oscillating unit 16 supplies a signal for frequency conversion to the frequency converting unit 12I. In addition, the local oscillating unit 16 shifts a phase of the signal for the frequency conversion supplied to the frequency converting unit 12I by 90 degrees and supplies the signal for the frequency conversion to the frequency converting unit 12Q.

The AGC control unit 17 determines the RF gain and the COMP. gain on the basis of outputs of the AD converting unit 15I and 15Q and notifies the variable gain amplifier 11 and the variable step gain BB amplifiers 14I and 14Q of the RF gain and the COMP. gain, respectively. The OFDM demodulating unit 18 demodulates a transmitted symbol on the basis of the I component and the Q component of the digitized OFDM signal and outputs the symbol to a rear step.

In the receiving device 10, the OFDM signal input as the RF signal is amplified by the variable gain amplifier 11 according to the RF gain and is converted into the IF signal by the frequency converting units 12I and 12Q and the base band signals of the I component and the Q component are extracted by the BB filters 13I and 13Q. In addition, the I component and the Q component of the OFDM signal are amplified by the variable step gain BB amplifiers 14I and 14Q according to the COMP. gain, are digitized by the AD converting units 15I and 15Q, and are demodulated into the symbol by the OFDM demodulating unit 18.

As illustrated in FIG. 1, in the receiving device 10 mounted to the portable terminal, a discrete control type amplifier in which an analog circuit is reduced and a small size and low consumption power are realized is adopted in partial components (the variable step gain BB amplifiers 14I and 14Q). However, in the case in which the discrete control type amplifier is adopted, if a steep gain variation is generated, a characteristic of the OFDM demodulation may be notably deteriorated in general.

Therefore, a method of additionally mounting a continuous control amplifier to suppress the steep gain variation from being generated is known (for example, refer to NPL 1). However, in this method, a circuit scale and consumption power may be increased.

Therefore, as illustrated in FIG. 2, a method of performing digital correction on an ADC output is suggested as another method of suppressing the steep gain variation from being generated (for example, refer to NPL 2).

FIG. 2 illustrates an example of a configuration of a receiving device according to the related art that includes a digital correcting unit to perform the digital correction on the ADC output, is mounted as an LSI to a portable terminal, and receives an OFDM signal.

A receiving device 20 includes a variable step gain amplifier 21, frequency converting units 12I and 12Q, BB filters 13I and 13Q, variable step gain BB amplifiers 14I and 14Q, AD converting units (ADC) 15I and 15Q, digital correcting units 22I and 22Q, a local oscillating unit (LO Gen.) 16, an AGC control unit (AGC CTRL LOGIC) 23, and an OFDM demodulating unit (DMD) 18.

In the receiving device 20, the variable gain amplifier 11 and the AGC control unit 17 of the receiving device 10 of FIG. 1 are replaced by a variable step gain amplifier 21 and an AGC control unit 23, respectively, a digital correcting unit 22I is provided between the AD converting unit 15I and the OFDM demodulating unit 18, and a digital correcting unit 22Q is provided between the AD converting unit 15Q and the OFDM demodulating unit 18.

The variable step gain amplifier 21 gradually amplifies an OFDM signal to be an RF signal, according to the RF gain notified from the AGC control unit 17, and outputs the OFDM signal to the frequency converting units 12I and 12Q.

The digital correcting unit 22I is operated to correct a gain variation generated in an output of the AD converting unit 15I by a step response (gradual amplification) in an analog circuit, according to correction gain notified from the AGC control unit 23. The digital correcting unit 22Q is operated to correct a gain variation generated in an output of the AD converting unit 15Q by a step response in an analog circuit, according to correction gain notified from the AGC control unit 23.

The AGC control unit 23 determines the RF gain, the COMP. gain, and the correction gain, on the basis of outputs of the digital correcting units 22I and 22Q, and notifies the variable step gain amplifier 21, the variable step gain BB amplifiers 14I and 14Q, and the digital correcting units 22I and 22Q of the RF gain, the COMP. gain, and the correction gain.

Because components common to the components of the receiving device 10 of FIG. 1 are denoted with the same reference numerals, explanation thereof is omitted.

CITATION LIST

Non Patent Literature

[NPL 1]
K. Vavelidis, et al, "A 65 nm CMOS Multi-Standard, Multi-Band Mobile TV Tuner", 2007 IEEE
[NPL 2]
G. Spalink, "Attenuator and method for attenuate", Pub. No.: US2012/0225631 A1, Pub. Date: Sep. 6, 2012

SUMMARY

Technical Problem

The digital correction by the digital correcting units 22I and 22Q will be described with reference to FIGS. 3A and 3B.

FIG. 3A illustrates ideal digital correction of the digital correcting units 22I and 22Q. Specifically, inverse characteristics of the step response of the variable step gain amplifier 21 according to the RF gain and the step response of the variable step gain BB amplifier 14I according to the COMP. gain are realized by the digital correcting unit 22 to prevent the steep gain variation from being generated in an input for the OFDM demodulating unit 18.

However, in actuality, a PVT variation is generally generated in the analog circuit. Therefore, as illustrated in FIG. 3B, timings of the step responses of the variable step gain amplifier 21 and the variable step gain BB amplifier 14I are not matched with each other. For this reason, the correction may not be performed at appropriate timing in the digital correcting unit 22, the signal may become a signal of a high (or low) level in only a partial section of the input for the OFDM demodulating unit 18, and OFDM demodulation performance may be deteriorated.

It is desirable to suppress demodulation performance in a receiving device from being deteriorated.

Solution to Problem

According to an embodiment of the present disclosure, there is provided a receiving device that receives a signal in which a data symbol and invalidation data are arranged. The receiving device includes an amplifying unit that amplifies the input signal and a gain adjusting unit that adjusts gain of the amplifying unit in a section of the invalidation data.

The input signal may be an OFDM signal and the invalidation data may be a guard interval.

The amplifying unit may be an analog circuit that changes gain discretely.

The receiving device according to the embodiment of the present disclosure may further include a digital correcting unit that has an inverse characteristic of a step response by the amplifying unit.

The receiving device according to the embodiment of the present disclosure may further include a demodulating unit that demodulates the OFDM signal after digital correction. The demodulating unit may detect data timing showing start timing of the data symbol to be used to remove the guard interval, shift the data timing by a predetermined delay amount, generate guard interval timing showing start timing of the guard interval, and notify the gain adjusting unit of the guard interval timing.

The gain adjusting unit may adjust the gain of the amplifying unit to match an RMS value of the OFDM signal after digital correction with a reference value.

The gain adjusting unit may adjust the gain of the amplifying unit to match a peak value of the OFDM signal after digital correction with a reference value.

The gain adjusting unit may adjust the gain of the amplifying unit in synchronization with the guard interval timing.

When an RMS value or a peak value of the OFDM signal after digital correction is not in a preset range, the gain adjusting unit may adjust the gain of the amplifying unit, regardless of the guard interval timing.

When an RMS value or a peak value of the OFDM signal after digital correction is not in a preset range, the gain adjusting unit may change time constant to a larger value.

According to another embodiment of the present disclosure, there is provided a receiving method of a receiving device that receives a signal in which a data symbol and invalidation data are arranged. The receiving method includes amplifying the input signal by the receiving device and adjusting gain of the amplification by the receiving device in a section of the invalidation data.

According to still another embodiment of the present disclosure, there is provided a non-transitory computer-readable storage medium storing program for controlling a receiving device that receives a signal in which a data symbol and invalidation data are arranged. The program causes a computer of the receiving device to execute a process including amplifying the input signal and adjusting gain of the amplification in a section of the invalidation data.

In the embodiment of the present disclosure, the gain of the amplification is adjusted in the section of the invalidation data.

Advantageous Effects of Invention

According to embodiments of the present disclosure, demodulation performance can be suppressed from being deteriorated.

BRIEF DESCRIPTION OF DRAWINGS

FIG. 1 is a block diagram illustrating a configuration example of a receiving device according to the related art that receives an OFDM signal;

FIG. 2 is a block diagram illustrating a configuration example of a receiving device that is configured to perform digital correction on a step response of an analog circuit;

[FIG. 3]

FIG. 4 is a diagram illustrating a symbol configuration of an OFDM signal;

FIG. 5 is a block diagram illustrating a configuration example of a receiving device to which the present disclosure is applied;

FIG. 6 is a block diagram illustrating a detailed configuration example of an OFDM demodulating unit of FIG. 5;

FIG. 7 is a diagram illustrating generation of G.I. timing; and

FIG. 8 is a block diagram illustrating a detailed configuration example of an AGC control unit of FIG. 5.

DESCRIPTION OF EMBODIMENTS

Hereinafter, best modes (hereinafter, referred to as embodiments) to carry out the present disclosure will be described in detail with reference to the drawings.

<With Respect to Symbol Configuration of OFDM Signal>

Figure 4:
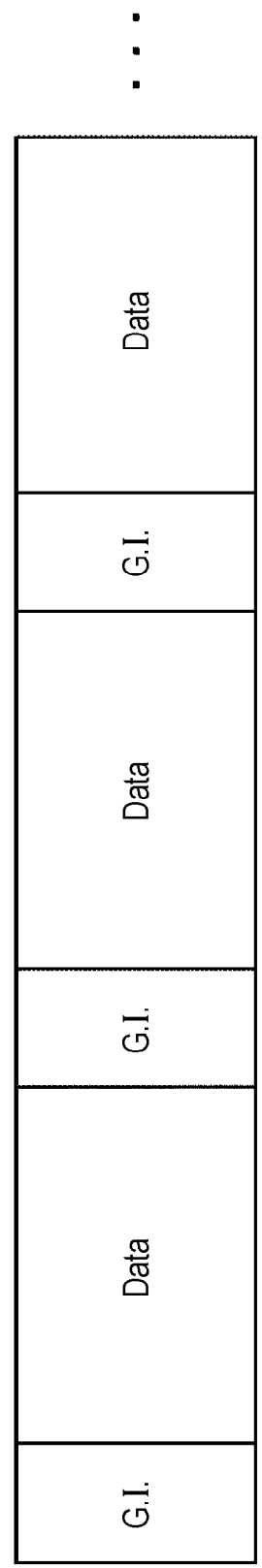
[FIG. 4]

FIG. 4 illustrates a general symbol configuration of an OFDM signal received by a receiving device according to an embodiment.

As illustrated in FIG. 4, in the OFDM signal, a guard interval (hereinafter, referred to as the G.I.) is provided before a data symbol, so that the data symbol and the G.I. are alternately arranged. The G.I. is obtained by copying an end portion of the data symbol to be continuous behind and is provided as delay wave measures. The G.I. is removed before being subjected to FFT in an OFDM demodulation process. Therefore, even though a gain variation is generated in the G.I. of the OFDM signal, this does not affect the OFDM demodulation process.

Therefore, in this embodiment, a step response (gradual switching of gain) by an analog circuit is performed in synchronization with the G.I.

<Configuration Example of Receiving Device According to Embodiment of Present Disclosure>

Figure 5:
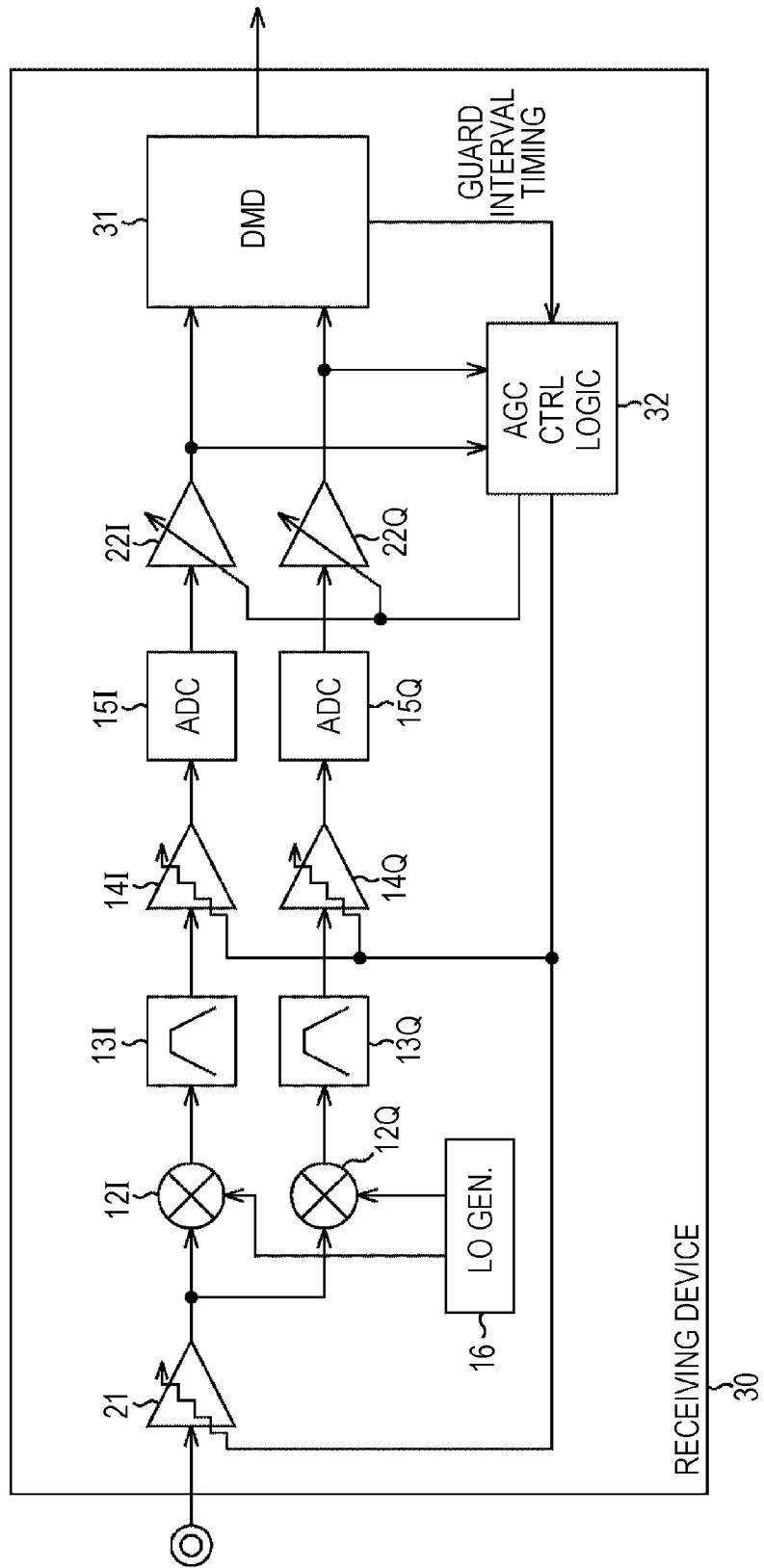
[FIG. 5]

FIG. 5 illustrates a configuration example of a receiving device according to an embodiment of the present disclosure that receives an OFDM signal.

A receiving device 30 includes a variable step gain amplifier 21, frequency converting units 12I and 12Q, BB filters 13I and 13Q, variable step gain BB amplifiers 14I and 14Q, AD converting units (ADC) 15I and 15Q, digital correcting units 22I and 22Q, a local oscillating unit (LO Gen.) 16, an OFDM demodulating unit (DMD) 31, and an AGC control unit (AGC CTRL LOGIC) 32.

Figure 1:
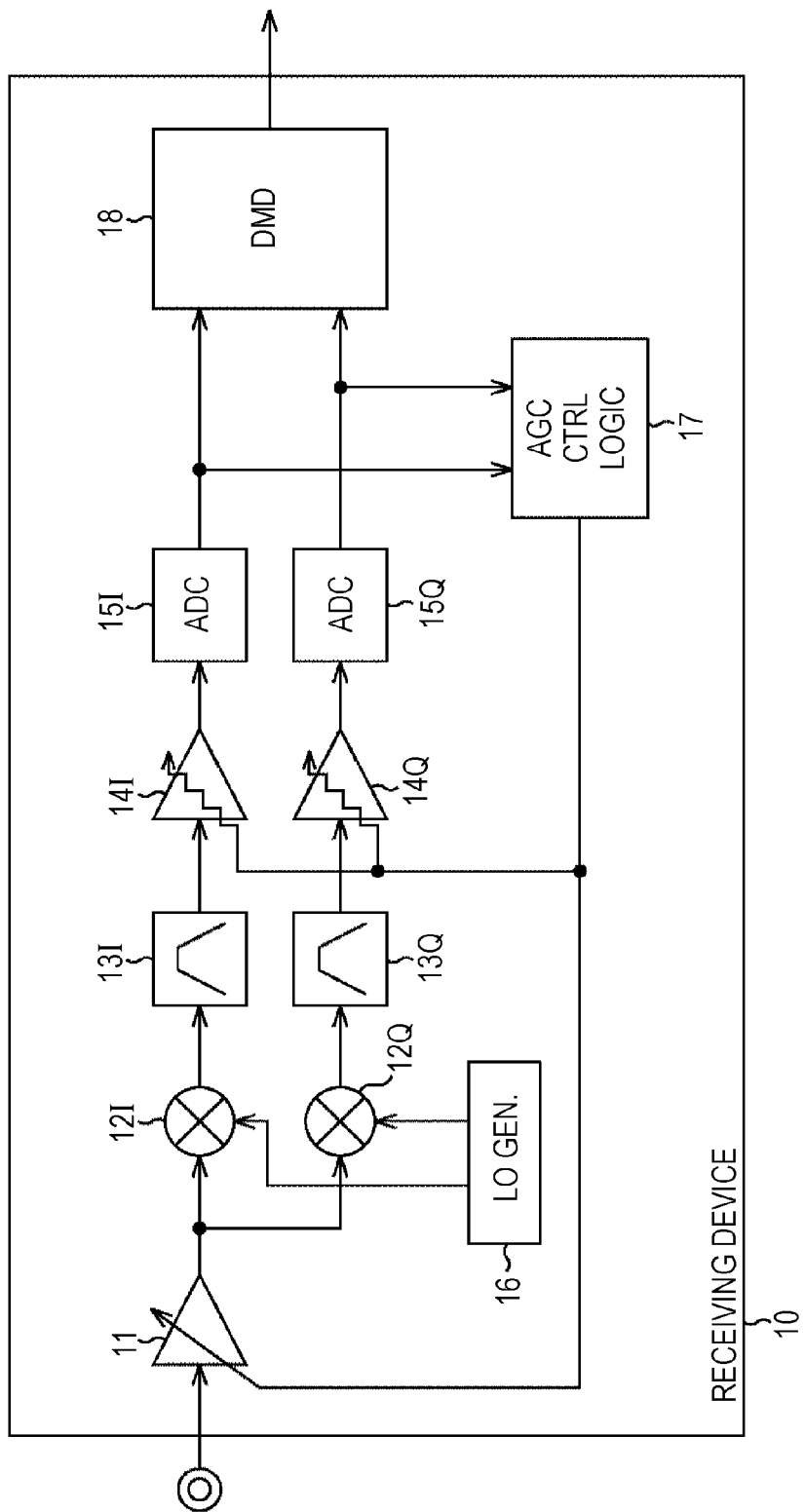
[FIG. 1]
Figure 2:
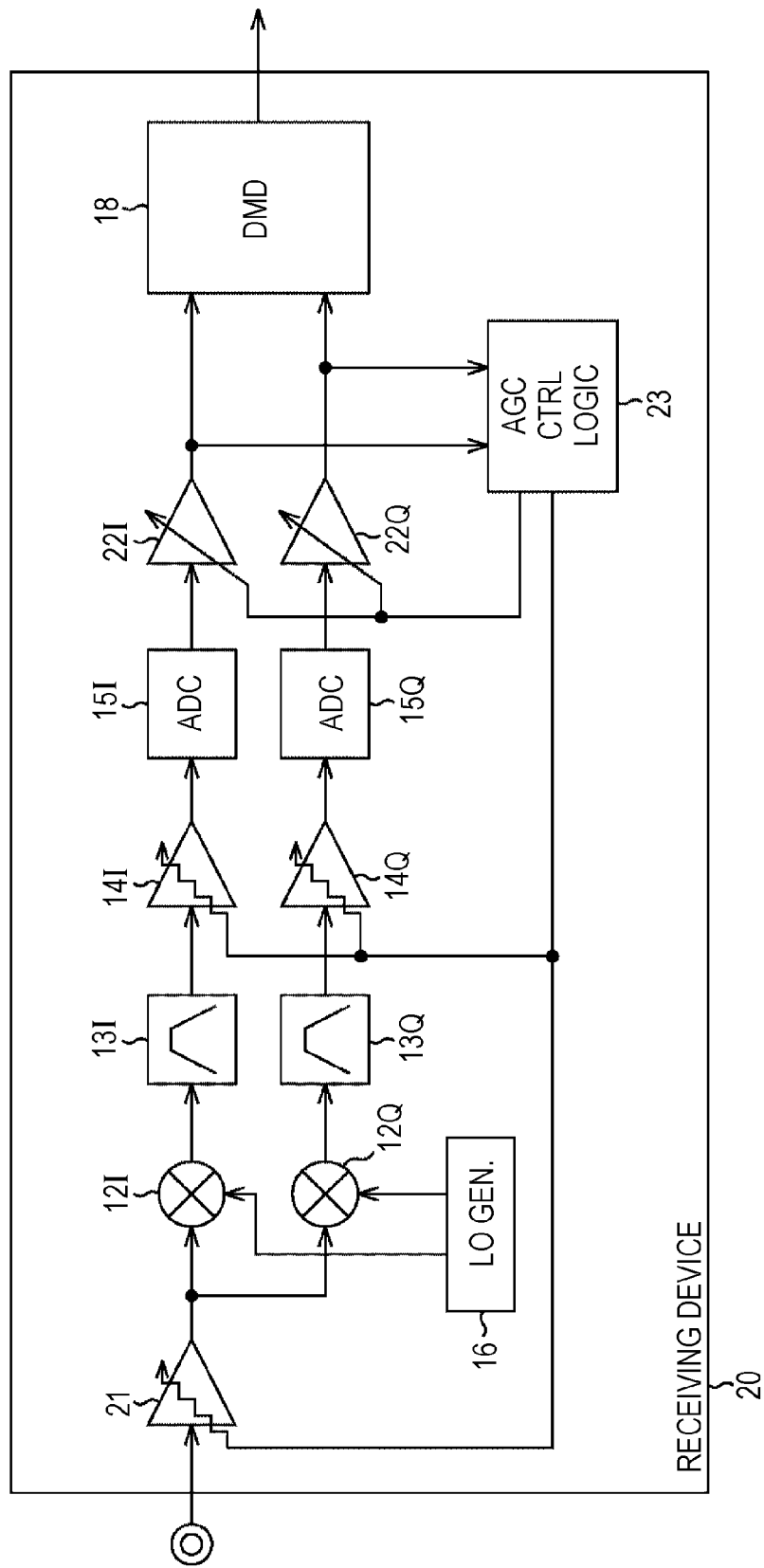
[FIG. 2]
Figure 3A:
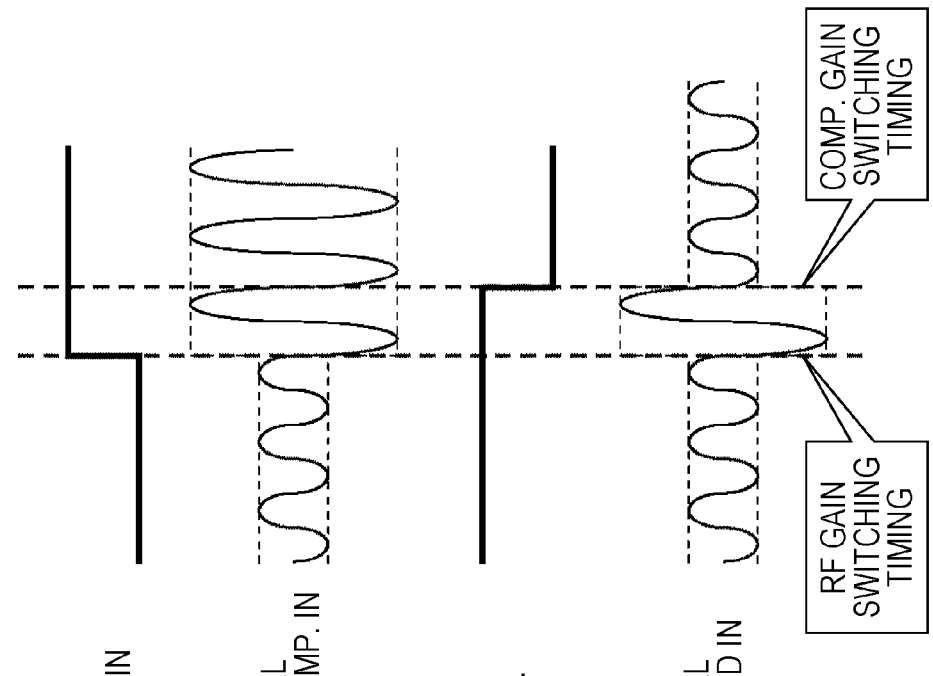
FIGS. 3A and 3B are diagrams illustrating digital correction.
Figure 3B:
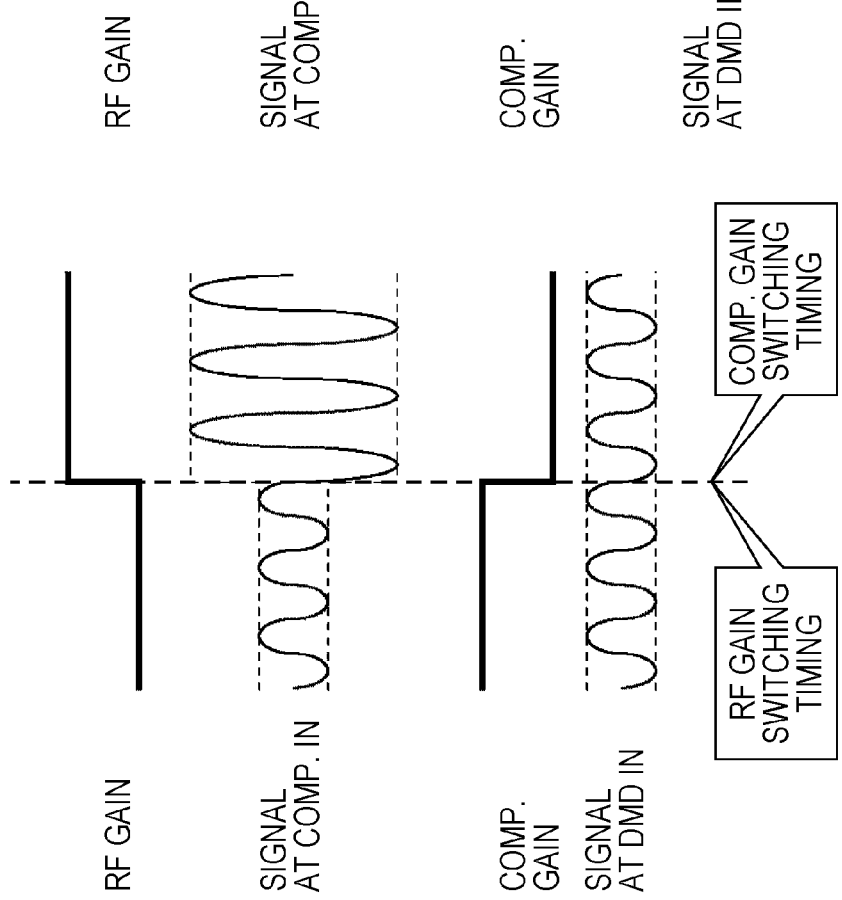

In the receiving device 30, the AGC control unit 23 and the OFDM demodulating unit 18 of the receiving device 20 of FIG. 2 are replaced by an AGC control unit 32 and an OFDM demodulating unit 31, respectively.

The OFDM demodulating unit 31 demodulates a transmitted symbol, on the basis of an I component and a Q component of a digitized OFDM signal, and outputs the symbol to a rear step. In addition, the OFDM demodulating unit 31 detects G.I. timing, on the basis of the I component and the Q component of the digitized OFDM signal, and notifies the AGC control unit 32 of the G.I. timing.

The AGC control unit 32 determines RF gain, COMP. gain, and correction gain, on the basis of outputs of the digital correcting units 22I and 22Q, and notifies the variable step gain amplifier 21, the variable step gain BB amplifiers 14I and 14Q, and the digital correcting units 22I and 22Q of the RF gain, the COMP. gain, and the correction gain, according to the G.I. timing notified from the OFDM demodulating unit 31, respectively.

Because components common to the components of the receiving device 20 of FIG. 2 are denoted with the same reference numerals, explanation thereof is omitted.

Figure 6:
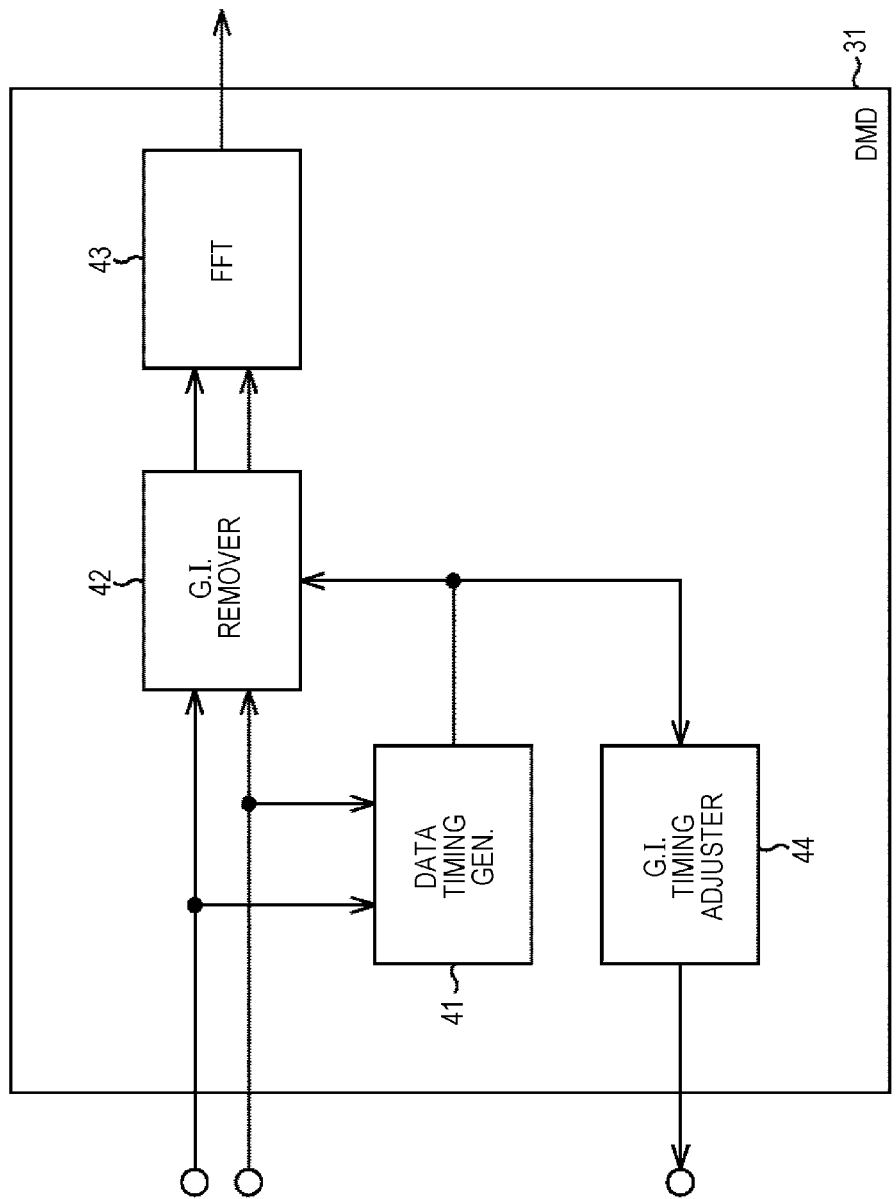
[FIG. 6]
Figure 7:
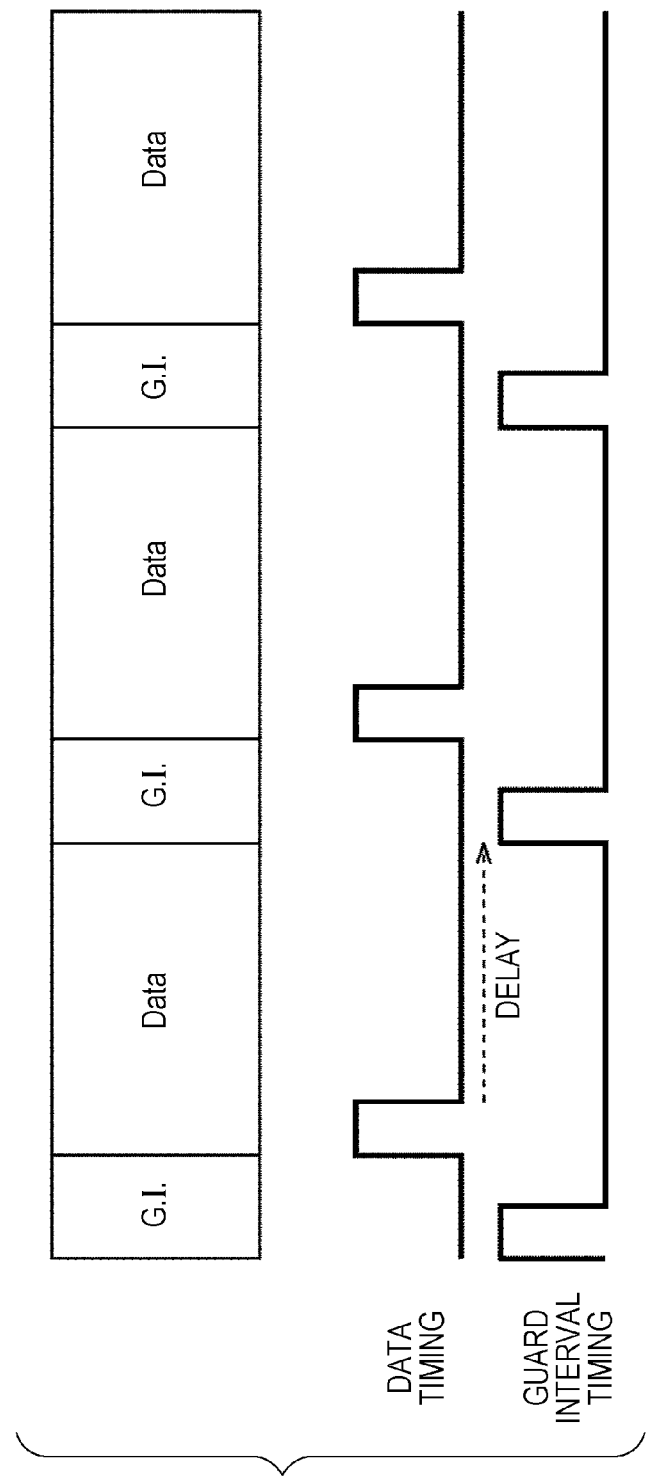
[FIG. 7]

Next, the OFDM demodulating unit 31 will be described with reference to FIGS. 6 and 7. FIG. 6 illustrates a detailed configuration example of the OFDM demodulating unit 31. FIG. 7 illustrates generation of the G.I. timing in the OFDM demodulating unit 31.

The OFDM demodulating unit 31 includes a data timing generating unit (Data Timing Gen.) 41, a G.I. removing unit (G.I. Remover) 42, an FFT unit 43, and a G.I. timing adjusting unit 44.

As illustrated in FIG. 7, the data timing generating unit 41 detects a start of a data symbol section of the OFDM signal from outputs of the digital correcting units 22I and 22Q of a previous step and notifies the G.I. removing unit 42 and the G.I. timing adjusting unit 44 of the start as data timing. The G.I. removing unit 42 removes the G.I. from the outputs of the digital correcting units 22I and 22Q, on the basis of the notified data timing, and outputs only the remaining data to the FFT unit 43.

The FFT unit 43 executes the FFT on the data input from the G.I. removing unit 42 and demodulates the transmitted data. The G.I. timing adjusting unit 44 offsets the notified data timing by a predetermined delay amount (length of a data section), generates the G.I. timing, and outputs the G.I. timing to the AGC control unit 32.

Figure 8:
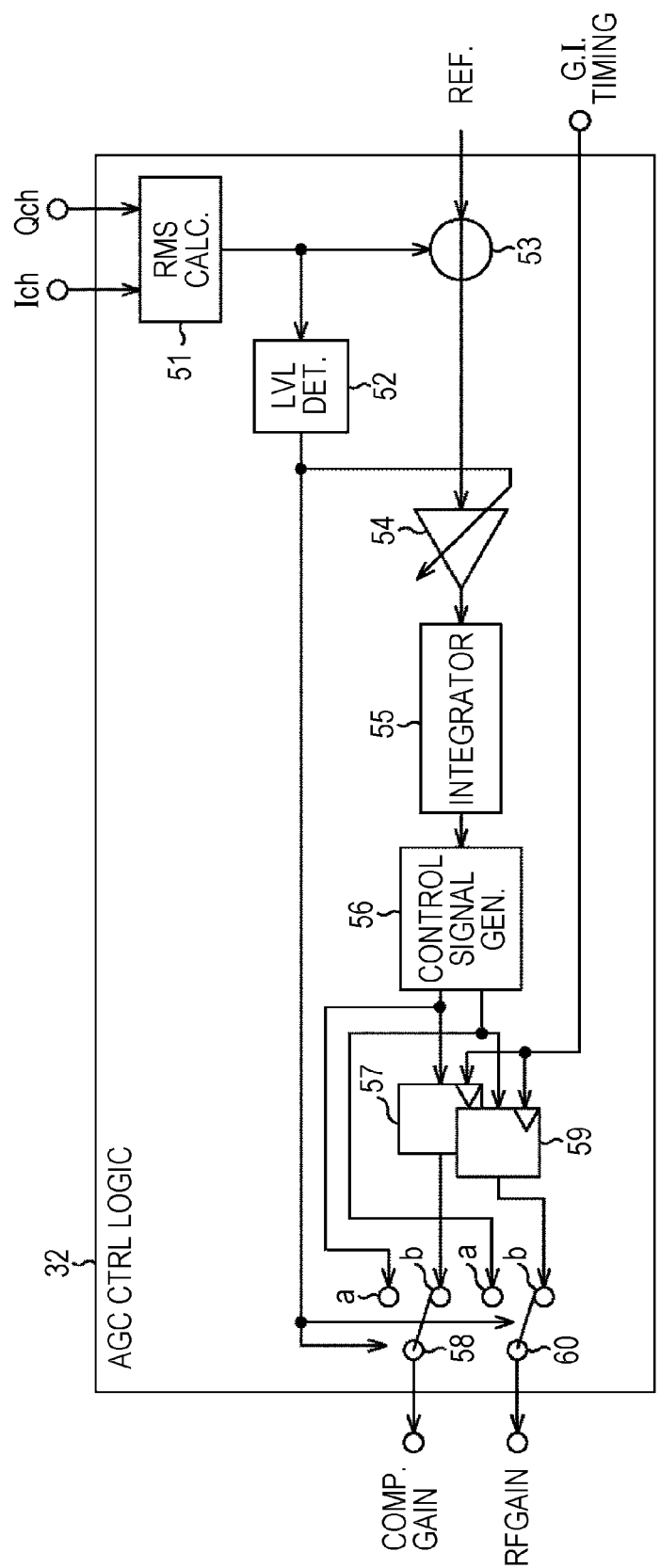
[FIG. 8]

Next, the AGC control unit 32 will be described. FIG. 8 illustrates a detailed configuration example of the AGC control unit 32. However, components of the digital correcting units 22I and 22Q are not illustrated.

The AGC control unit 32 includes an operation unit (RMS Calc.) 51, a level detecting unit (Lvl Det.) 52, a difference operation unit 53, a multiplying unit 54, an integration operation unit (Integrator) 55, a control signal generating unit (Control Signal Gen.) 56, an FF unit 57, a switch 58, an FF unit 59, and a switch 60.

The operation unit 51 receives the I component and the Q component of the OFDM signal from the digital correcting units 22I and 22Q, operates an RMS value (or a peak value), and outputs the RMS value to the level detecting unit 52 and the difference operation unit 53. When the RMS value (or the peak value) from the operation unit 51 is not in a preset range, the level detecting unit 52 notifies the multiplying unit 54 and the switches 58 and 60 of a signal showing that the RMS value is not in the preset range.

The difference operation unit 53 operates a difference of the RMS value (or the peak value) from the operation unit 51 and a reference value (Ref.) and outputs the difference to the multiplying unit 54. The multiplying unit 54 multiplies the difference of the RMS value (or the peak value) and the reference value with predetermined time constant and outputs an obtained value to the integration operation unit 55. When the notification from the level detecting unit 52 is given, the time constant is set as a large value, as compared with when the notification is not given.

The integration operation unit 55 integrates an output of the multiplying unit 54 and outputs an operation result thereof to the control signal generating unit 56. The control signal generating unit 56 determines the RF gain and the COMP. gain on the basis of an input from the integration operation unit 55, outputs the COMP. gain to the FF unit 57 and an input terminal 58a of the switch 58, and outputs the RF gain to the FF unit 59 and an input terminal 60a of the switch 60.

The FF unit 57 outputs the COMP. gain to the input terminal 58b of the switch 58, in synchronization with the G.I. timing input to a CK thereof. When the notification from the level detecting unit 52 is given, the switch 58 is switched to the side of the input terminal 58a and outputs the COMP. gain output from the control signal generating unit 56 to a rear step and when the notification is not given, the switch 58 is switched to the side of the input terminal 58b and outputs the COMP. gain output from the FF unit 57 in synchronization with the G.I. timing to a rear step.

The FF unit 59 outputs the RF gain to an input terminal 60b of the switch 60, in synchronization with the G.I. timing input to a CK thereof. When the notification from the level detecting unit 52 is given, the switch 60 is switched to the side of the input terminal 60a and outputs the RF gain output from the control signal generating unit 56 to a rear step and when the notification is not given, the switch 60 is switched to the side of the input terminal 60b and outputs the RF gain output from the FF unit 59 in synchronization with the G.I. timing to a rear step.

In the AGC control unit 32 configured as described above, because the RF gain and the COMP. gain based on the RMS value (or the peak value) of the OFDM signal are notified in synchronization with the G.I. timing, the gain adjustment can be appropriately performed without affecting the OFDM demodulation performance.

However, when the RMS value (or the peak value) of the OFDM signal is not in the preset range, the possibility of the G.I. timing being not correctly detected is high and it is necessary to perform the gain adjustment as fast as possible. For this reason, the RF gain and the COMP. gain in which the time constant is set as a large value are notified without being synchronized with the G.I. timing.

As described above, according to the receiving device 30 according to this embodiment, the OFDM demodulation performance can be suppressed from being deteriorated due to the deviation of the step response of the analog circuit. As a result, because the specification of the analog circuit can be greatly alleviated, a small size and low consumption power can be realized.

The present disclosure can be applied to all receiving devices that receive a signal in which a section of a data symbol and a section invalid as data are alternately arranged, like the OFDM signal in which the G.I. and the data are alternately arranged.

However, the series of processes described above can be executed by hardware and can be executed by software.

When the series of processes are executed by the software, a program configuring the software is installed in a computer. Here, the computer includes a computer that is embedded in dedicated hardware and a general-purpose personal computer that can execute various functions by installing various programs.

It should be understood by those skilled in the art that various modifications, combinations, sub-combinations and alterations may occur depending on design requirements and other factors insofar as they are within the scope of the appended claims or the equivalents thereof.

Also, the present disclosure can take the following configurations.

(1)

A receiving device that receives a signal in which a data symbol and invalidation data are arranged, the receiving device including:

an amplifying unit that amplifies the input signal; and a gain adjusting unit that adjusts gain of the amplifying unit in a section of the invalidation data.

(2)

The receiving device according to (1) above, wherein the input signal is an OFDM signal and the invalidation data is a guard interval.

(3)

The receiving device according to (1) or (2) above, wherein the amplifying unit is an analog circuit that changes gain discretely.

(4)

The receiving device according to any of (1) to (3) above, further including:

a digital correcting unit that has an inverse characteristic of a step response by the amplifying unit.

(5)

The receiving device according to (4) above, further including:

a demodulating unit that demodulates the OFDM signal after digital correction, wherein the demodulating unit detects data timing showing start timing of the data symbol to be used to remove the guard interval, shifts the data timing by a predetermined delay amount, generates guard interval timing showing start timing of the guard interval, and notifies the gain adjusting unit of the guard interval timing.

(6)

The receiving device according to (4) above, wherein the gain adjusting unit adjusts the gain of the amplifying unit to match an RMS value of the OFDM signal after digital correction with a reference value.

(7)

The receiving device according to (4) above, wherein the gain adjusting unit adjusts the gain of the amplifying unit to match a peak value of the OFDM signal after digital correction with a reference value.

(8)

The receiving device according to (4) above, wherein the gain adjusting unit adjusts the gain of the amplifying unit in synchronization with the guard interval timing.

(9)

The receiving device according to (4) above, wherein, when an RMS value or a peak value of the OFDM signal after digital correction is not in a preset range, the gain adjusting unit adjusts the gain of the amplifying unit, regardless of the guard interval timing.

(10)

The receiving device according to (4) above, wherein, when an RMS value or a peak value of the OFDM signal after digital correction is not in a preset range, the gain adjusting unit changes time constant to a larger value.

(11)

A receiving method of a receiving device that receives a signal in which a data symbol and invalidation data are arranged, the receiving method including:
 amplifying the input signal by the receiving device; and
 adjusting gain of the amplification by the receiving device in a section of the invalidation data.

(12)

A non-transitory computer-readable storage medium storing program for controlling a receiving device that receives a signal in which a data symbol and invalidation data are arranged, the program causing a computer of the receiving device to execute a process including:
 amplifying the input signal; and
 adjusting gain of the amplification in a section of the invalidation data.

REFERENCE SIGNS LIST

30 Receiving device
31 OFDM demodulating unit
32 AGC control unit
41 Data timing generating unit
44 G.I. timing adjusting unit
51 Operation unit
52 Level detecting unit
56 Control signal generating unit
57 FF unit
58 Switch
59 FF unit
60 Switch

The invention claimed is:

1. A receiving device that receives an OFDM signal in which data symbols and guard intervals are arranged, the receiving device comprising:
 an amplifying unit that amplifies the received OFDM signal, the amplifying unit being an analog circuit that changes gain discretely;
 a digital correcting unit that has an inverse characteristic of a step response of the amplifying unit;
 a demodulating unit that demodulates the OFDM signal after digital correction, and generates a notification indicating a start timing of an $n^{th}$ one of the guard intervals (n>1) by detecting a start timing of an $(n-1)^{th}$ one of the data symbols and generating the notification a predetermined amount of time after the start timing of the $(n-1)^{th}$ one of the data symbols; and
 a gain adjusting unit that adjusts gain of the amplifying unit in the $n^{th}$ one of the guard intervals based on the notification.

2. A receiving device that receives an OFDM signal in which a data symbol and a guard interval are arranged, the receiving device comprising:
 an amplifying unit that amplifies the received OFDM signal, the amplifying unit being an analog circuit that changes gain discretely;
 a digital correcting unit that has an inverse characteristic of a step response of the amplifying unit;
 a demodulating unit that demodulates the OFDM signal after digital correction, determines a start timing of the guard interval by detecting a start timing of the data symbol and shifting the start timing of the data symbol by a predetermined delay amount, and outputs a notification of the start timing of the guard interval; and
 a gain adjusting unit that adjusts gain of the amplifying unit in the guard interval based on the notification of the start timing of the guard interval,
 wherein the gain adjusting unit adjusts the gain of the amplifying unit to match an RMS value of the OFDM signal after digital correction with a reference value.

3. The receiving device according to claim 1, wherein the gain adjusting unit adjusts the gain of the amplifying unit to match a peak value of the OFDM signal after digital correction with a reference value.

4. The receiving device according to claim 1, wherein the gain adjusting unit adjusts the gain of the amplifying unit in synchronization with the start timing of the guard interval.

5. The receiving device according to claim 1, wherein, when an RMS value or a peak value of the OFDM signal after digital correction is not in a preset range, the gain adjusting unit adjusts the gain of the amplifying unit at a timing determined independently of the notification of the start timing of the guard interval.

6. A receiving device that receives an OFDM signal in which a data symbol and a guard interval are arranged, the receiving device comprising:
 an amplifying unit that amplifies the received OFDM signal, the amplifying unit being an analog circuit that changes gain discretely;
 a digital correcting unit that has an inverse characteristic of a step response of the amplifying unit;
 a demodulating unit that demodulates the OFDM signal after digital correction, determines a start timing of the guard interval by detecting a start timing of the data symbol and shifting the start timing of the data symbol by a predetermined delay amount, and outputs a notification of the start timing of the guard interval; and
 a gain adjusting unit that adjusts gain of the amplifying unit in the guard interval based on the notification of the start timing of the guard interval,
 wherein, when an RMS value or a peak value of the OFDM signal after digital correction is not in a preset range, the gain adjusting unit changes a time constant thereof to a larger value.

7. A method comprising:
 receiving an OFDM signal in which data symbols and guard intervals are arranged;
 amplifying the received OFDM signal by an amplifying unit;
 digitally correcting the amplified OFDM signal;
 demodulating the digitally corrected OFDM signal by a demodulating unit;
 generating a notification indicating a start timing of an $n^{th}$ one of the guard intervals by the demodulating unit by detecting a start timing of and $(n-1)^{th}$ one of the data symbols and generating the notification a predetermined amount of time after the start timing of the $(n-1)^{th}$ one of the data symbols; and adjusting gain of the amplifying unit in the $n^{th}$ one of the guard intervals based on the notification.

8. A non-transitory computer-readable storage medium storing a program for controlling a receiving device that receives an OFDM signal in which data symbols and guard intervals are arranged, amplifies the received OFDM signal by an amplifying unit, digitally corrects the amplified OFDM signal, and demodulates the digitally corrected OFDM signal by a demodulating unit, the program being executable to cause receiving device operations comprising:

generating a notification indicating a start timing of an $n^{th}$ one of the guard intervals (n>1) by the demodulating unit by detecting a start timing of an $(n-1)^{th}$ one of the data symbols and generating the notification a predetermined amount of time after the start timing of the $(n-1)^{th}$ one of the data symbols; and adjusting gain of the amplifying unit in the $n^{th}$ one of the guard intervals based on the notification.

9. A receiving device that receives an OFDM signal in which data symbols and guard intervals are arranged, the receiving device comprising:

an amplifying unit that amplifies the OFDM signal, the amplifying unit being an analog circuit that changes gain discretely;

a digital correcting unit that has an inverse characteristic of a step response of the amplifying unit; and a gain adjusting unit that adjusts gain of the amplifying unit at adjustment timing, wherein the gain adjusting unit is configured to determine each of the adjustment timings such that:

when an RMS value or a peak value of the OFDM signal after digital correction is in a preset range, the adjustment timings are determined based on received notifications of start timings of the guard intervals such that the adjustment timings are each in one of the guard intervals, and when the RMS value or the peak value of the OFDM signal after digital correction is not in the preset range, the adjustment timing is set independently of the notification of the start timing of the guard interval.

10. The receiving device of claim 9, further comprising:

a demodulating unit that demodulates the OFDM signal after digital correction, and generates the notifications of the start timings of the guard intervals, wherein the demodulating unit generates the notification of the start timing of an $n^{th}$ one of the guard intervals (n>1) by detecting a start timing of an $(n-1)^{th}$ one of the data symbols and generating the notification a predetermined amount of time after the start timing of the $(n-1)^{th}$ one of the data symbols.

11. The receiving device of claim 9, wherein the gain adjusting unit adjusts the gain of the amplifying unit to match an RMS value of the OFDM signal after digital correction with a reference value.

12. The receiving device of claim 9, wherein the gain adjusting unit adjusts the gain of the amplifying unit to match a peak value of the OFDM signal after digital correction with a reference value.

13. The receiving device of claim 9, wherein the gain adjusting unit determines the adjustment timings such that, when the RMS value or the peak value of the OFDM signal after digital correction is in the preset range, the adjustment timings are synchronized with the notifications of the start timings of the guard intervals.

14. The receiving device of claim 9, wherein, when the RMS value or the peak value of the OFDM signal after digital correction is not in the preset range, the gain adjusting unit changes a time constant thereof to a larger value.

15. The receiving device of claim 9, wherein the gain adjusting unit includes a gain control signal generator that generates a first gain control signal and a second gain control signal, an adjustment timing unit that receives the first gain control signal and the notifications and outputs a third gain control signal based on the first gain control signal such that the third gain control signal changes value only at timings corresponding to the notifications, and a selection unit that selects the third gain control signal to output to the amplifying unit when the RMS value or the peak value of the OFDM signal after digital correction is in the preset range, and selects the first gain control signal to output to the amplifying unit when the RMS value or the peak value of the OFDM signal after digital correction is not in the preset range.

* * * * *